United States Patent

(12) United States Patent
Ka

(10) Patent No.: US 9,172,382 B2
(45) Date of Patent: Oct. 27, 2015

(54) SEMICONDUCTOR DEVICE AND OPERATING METHOD THEREOF

(71) Applicant: SK hynix Inc., Gyeonggi-do (KR)

(72) Inventor: Dong-Yoon Ka, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/487,933

(22) Filed: Sep. 16, 2014

(65) Prior Publication Data

US 2015/0244379 A1  Aug. 27, 2015

(30) Foreign Application Priority Data

Feb. 24, 2014  (KR) .................. 10-2014-0021062
Jun. 26, 2014  (KR) .................. 10-2014-0078946

(51) Int. Cl.
H03L 7/00 (2006.01)
G01R 23/02 (2006.01)
H03K 21/08 (2006.01)

(52) U.S. Cl.
CPC *H03L 7/00* (2013.01); *G01R 23/02* (2013.01); *H03K 21/08* (2013.01)

(58) Field of Classification Search
USPC .................................. 327/151, 160
See application file for complete search history.

(56) References Cited

U.S. PATENT DOCUMENTS

| | | | | |
|---|---|---|---|---|
| 5,691,993 A | * | 11/1997 | Fredrickson | 714/761 |
| 2003/0174781 A1 | * | 9/2003 | Itou et al. | 375/265 |
| 2006/0092902 A1 | * | 5/2006 | Schmidt | 370/342 |
| 2009/0115992 A1 | * | 5/2009 | Sakai | 356/5.01 |
| 2010/0054304 A1 | * | 3/2010 | Barnes et al. | 375/130 |
| 2010/0114565 A1 | * | 5/2010 | Kinns | 704/201 |
| 2010/0183063 A1 | * | 7/2010 | Fukagawa et al. | 375/224 |
| 2010/0225541 A1 | * | 9/2010 | Hertzog et al. | 342/387 |
| 2013/0307509 A1 | * | 11/2013 | Henzler | 323/283 |

FOREIGN PATENT DOCUMENTS

KR  1020100104245  9/2010

* cited by examiner

*Primary Examiner* — Adam Houston
(74) *Attorney, Agent, or Firm* — IP & T Group LLP

(57) ABSTRACT

A semiconductor device includes first and second circuits disposed separately from each other. The first circuit may include: a counting unit suitable for generating count codes, each bit of which is cyclically changing, wherein the count codes include a number of toggles of a sampling signal toggling with a preset frequency representing a distance of single round trip of the sampling signal between the first and second circuits; and a pulse generation unit suitable for generating a measurement pulse according to the count codes representing the distance, wherein the pulse generation unit determines a pulse width of the measurement pulse according to the distance.

18 Claims, 5 Drawing Sheets

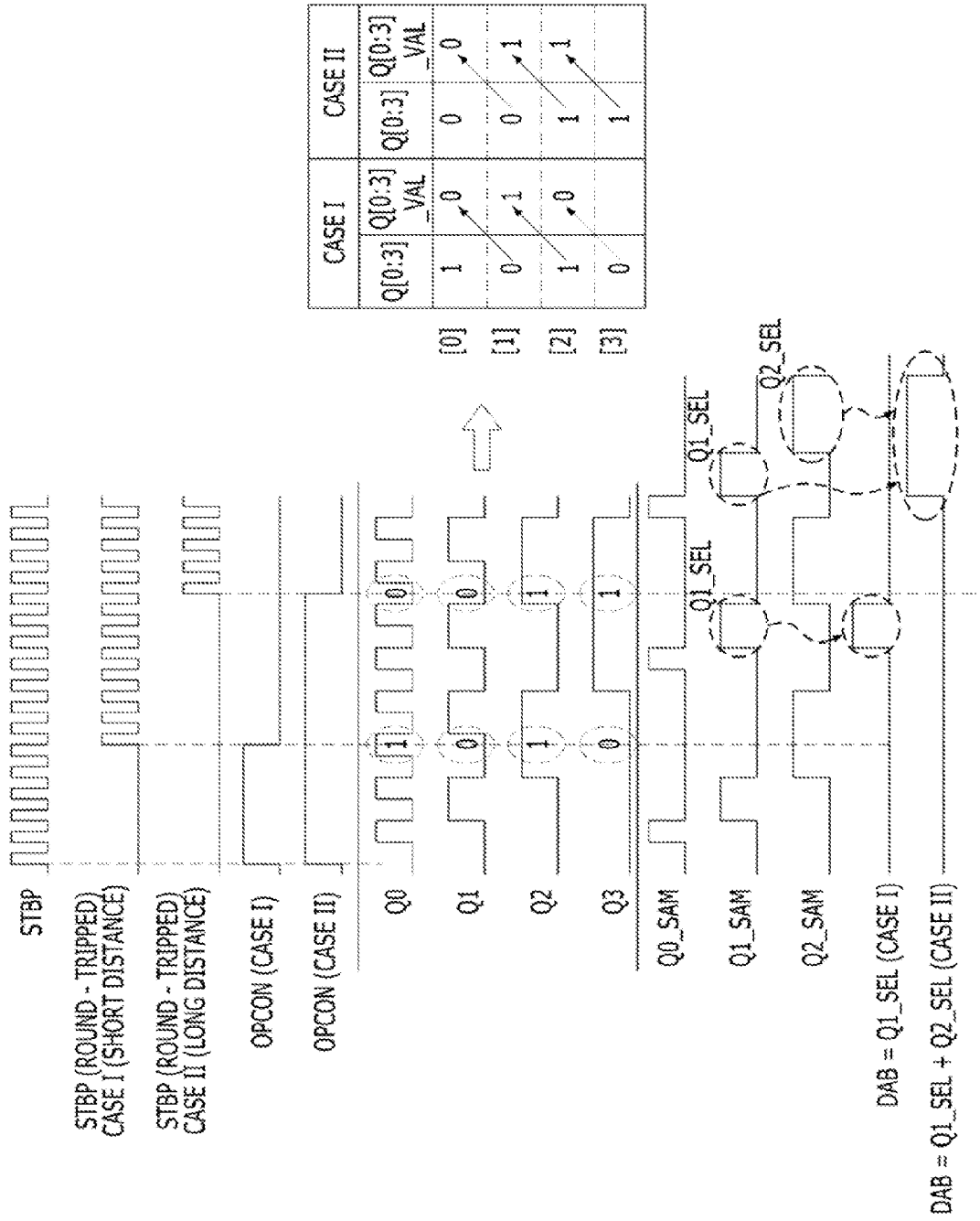

SEMICONDUCTOR DEVICE AND OPERATING METHOD THEREOF

CROSS-REFERENCE TO RELATED APPLICATIONS

The present application claims priority of Korean Patent Application No. 10-2014-0021062, filed on Feb. 24, 2014 and Korean Patent Application No. 10-2014-0078946, filed on Jun. 26, 2014, which are incorporated herein by reference in its entirety.

BACKGROUND

1. Field

Various exemplary embodiments of the present invention relate to a semiconductor design technology and, more particularly, to a semiconductor device including two or more circuits physically separated from each other, and an operating method thereof.

2. Description of the Related Art

A single semiconductor device may include multiple circuits that are physically separate and are capable of performing independent operations.

The semiconductor device circuits may share common signal transfer lines. The common signal transfer lines transfer signals throughout the device. These signals may include common command and data signals.

However, since the physical distance from the signal source (which may be internal or external) to each of the circuits may not be the same, the common signals often do not arrive at the circuits at the same time. In other words, the signal arrival times are not synchronized.

FIG. 1 is a block diagram illustrating a conventional semiconductor device.

Referring to FIG. 1, a first circuit 10 and a second circuit 20 are physically separated from each other in a conventional semiconductor device. The first circuit 10 includes an operation signal generation unit 14 and an internal circuit 12. The second circuit 20 includes an internal circuit 22. The internal circuits 12 and 22 of the first and second circuits 10 and 20 have separate paths A and B to the operation signal generation unit 14, and the distance a signal must travel is different. Particularly, path A between the internal circuit 12 and the operation signal generation unit 14, included in the first circuit 10, is shorter than the path B between the internal circuit 13 and the operation signal generation unit 14, as shown in FIG. 1.

The operation signal generation unit 14 transmits an operation signal OPSIG at the same time to the internal circuits 12 and 22 of the first and second circuits 10 and 20 through the paths A and B, which are different distances. But as discusses, the input timing of the operation signal OPSIG at each of the internal circuits 12 and 22 is different due to the differing lengths of paths A and B.

Because the internal circuits 12 and 22 have different signal input timing, this results in the operation timing of the internal circuits 12 and 22, in response to the operation signal OPSIG, being different. When the internal circuits 12 and 22 need to perform synchronous operations in response to the operation signal OPSIG, it is important to resolve this issue.

FIG. 2 is a block diagram illustrating another conventional semiconductor device.

Referring to conventional semiconductor device shown FIG. 2, it includes a delay section 216 with a shorter path A in to synchronize the operation timing of the internal circuits 12 and 22.

When the operation signal OPSIG is outputted from the operation signal generation unit 14 to the internal circuits 12 and 22 of the first and second circuits 10 and 20, the operation signal OPSIG is delayed by a delay section 216 in order to prevent timing issues between the internal circuits 12 and 22. The delay of the delay section 216 is designed in consideration of the travel time of the operation signal OPSIG on each of the paths A and B.

When the sum of the traveling time of the operation signal OPSIG on the path A and the delay of the delay section 216 is the same as the traveling time of the operation signal OPSIG on the path B, the input timings of the operation signal OPSIG at the internal circuits 12 and 22 are the same.

This is way the conventional art deals with this concern.

However, due to various factors, for example, unintended variation in the lengths of paths A and B that occur in mass-production, the delay of the delay section 216 may not synchronize the input timings of the operation signal OPSIG at the internal circuits 12 and 22, and this in turn may affect operation timing. To put it simply, there is room for improvement in the way that the conventional art is dealing with this concern.

If this concern is discovered after the mass-production of a batch of semiconductor devices, it is almost impossible to fix and it could result in the loss of substantial investment.

This timing concern not only applies to the situation that has been discussed, but may occur any time common signals are being sent to different locations. For example, when semiconductor devices have separate functional blocks or when multiple devices are grouped in a semiconductor system.

SUMMARY

Various exemplary embodiments are directed to a semiconductor device capable of allowing synchronized operations of physically separated inner elements and an operating method thereof.

In an embodiment of the present invention, a semiconductor device may include first and second circuits disposed separately from each other. The first circuit may include: a counting unit suitable for generating count codes, each bit of which is cyclically changing, wherein the count codes include a number of toggles of a sampling signal toggling with a preset frequency representing the distance of a single round trip of the sampling signal between the first and second circuits; and a pulse generation unit suitable for generating a measurement pulse according to the count codes representing the distance, wherein the pulse generation unit determines a pulse width of the measurement pulse according to the distance.

The first circuit may further include an operation signal generation unit suitable for generating and transmitting an operation signal to the first circuit at a falling edge of the measurement pulse, and generating and transmitting the operation signal to the second circuit at a rising edge of the measurement pulse.

The pulse generation unit may include an operation control section suitable for generating an operation control signal, which is activated during the single round trip of the sampling signal between the first and second circuits; a calculating section suitable for generating distance codes, which have a value corresponding to a half of a value of the count codes in response to deactivation of the operation control signal; a sampling section suitable for generating a plurality of sampling pulses by sampling first unit pulses of bits except for a most significant bit in the count codes per one cycle of the bits except for the most significant bit in the count codes; a pulse selecting section suitable for selecting one or more among the plurality of sampling pulses according to the distance codes; and a pulse combining section suitable for generating the measurement pulse, which has an activation period corresponding to a sum of activation periods of the sampling pulses selected by the pulse selecting section.

The calculating section may include a shifting part suitable for generating the distance codes by shifting each of bits except for a least significant bit in the count codes in a direction toward a position of a lower significant level.

The pulse selecting section may select one or more among the plurality of sampling pulses corresponding to the value of the distance codes.

In another embodiment of the present invention, a method for operating a semiconductor device including a first circuit and a second circuit disposed separately from each other may include: at the first circuit, generating and outputting a sampling signal, which toggles with a preset frequency, to the second circuit, and receiving the sampling signal returning from the second circuit; at the first circuit, generating count codes, each bit of which is cyclically changing, wherein the count codes include a number of toggles of the sampling signal representing a distance of a single round trip of the sampling signal between the first and second circuits; and at the first circuit, generating a measurement pulse according to the count codes representing the distance, wherein the generating of the measurement pulse determines a pulse width of the measurement pulse according to the distance.

The method may further include, at the first circuit, generating and transmitting an operation signal to the first circuit at a falling edge of the measurement pulse, and generating and transmitting the operation signal to the second circuit at a rising edge of the measurement pulse.

The generating of the measurement pulse may include: at the first circuit, generating an operation control signal, which is activated during the single round trip of the sampling signal between the first and second circuits; at the first circuit, generating distance codes, which have a value corresponding to a half of a value of the count codes in response to deactivation of the operation control signal; at the first circuit, generating a plurality of sampling pulses by sampling first unit pulses of bits except for a most significant bit in the count codes per one cycle of the bits except for the most significant bit in the count codes; at the first circuit, selecting one or more among the plurality of sampling pulses according to the distance codes; and at the first circuit, generating the measurement pulse, which has an activation period corresponding to a sum of activation periods of the sampling pluses selected by the selecting section.

The generating of the distance codes may include shifting each of bits except for a least significant bit in the count codes in a direction toward a position of a lower significant level.

The selecting may select one or more among the plurality of sampling pulses corresponding to the value of the distance codes.

In another embodiment of the present invention, a semiconductor system may include: a signal portion suitable transmitting an operation signal; a first portion suitable for performing an operation in response to the operation signal transmitted through a first path; and a second portion suitable for performing an operation in response to the operation signal transmitted through a second path, a length of which is different from a length of the first path. The signal portion may measure a length of the second path relative to the first path, and sequentially transmit the operation signal through the second path and the first path with a time interval corresponding to the measured distance of the second path for synchronous operations of the first and second portions.

The first path may have a negligible length compared to the length of the second path.

The semiconductor system may further include: a source portion suitable for generating and outputting a traveling signal through the second path; and a counting portion suitable for generating count codes by counting a clock in response to the output of the traveling signal from the source portion, wherein the second portion receives and returns back the traveling signal to, the signal portion through the second path, and wherein the signal portion generates round trip codes from the count codes during the round trip of the traveling signal between the source portion and the signal portion.

The signal portion may include: a pulse unit suitable for generating a measurement pulse representing the measured distance of the second path based on the round trip codes; and an operating signal unit suitable for generating and transmitting the operation signal to the first portion at a first edge of the measurement pulse, and generating and transmitting the operation signal to the second portion at a second edge of the measurement pulse.

The second edge may lead the first edge in time.

The pulse unit may include: a calculating section suitable for generating distance codes, which is a half of the round trip codes in a code value; a sampling section suitable for generating a plurality of sampling pulses by sampling first unit pulses of bits except for a most significant bit in the count codes per one cycle of the bits except for the most significant bit in the count codes; a pulse selecting section suitable for selecting one or more among the plurality of sampling pulses according to the distance codes; and a pulse combining section suitable for generating the measurement pulse based on a sum of preset states of the sampling pluses selected by the pulse selecting section.

The calculating section may include a shifting part suitable for generating the distance codes by shifting each of the bits except for a least significant bit in the round trip codes toward a position of a lower significant level.

The pure selecting section may select one or more among the plurality of sampling pulses corresponding to the code value of the distance codes.

According to the embodiments, after the distance between first and second circuits, which are disposed separately from each other, is measured based on the preset frequency of a sampling signal generated in the first circuit, and is represented by the activation period of a measurement pulse, the second circuit is operated based on the rising edge of the measurement pulse and the first circuit is operated based on the failing edge of the measurement pulse. As a consequence, it is possible to induce simultaneous operations regardless of a distance difference with respect to the first and second circuits disposed separately from each other.

BRIEF DESCRIPTION OF THE DRAWINGS

FIG. 6 is a timing diagram illustrating operations of a semiconductor device in accordance with an embodiment of the present invention.

DETAILED DESCRIPTION

Figure 1:
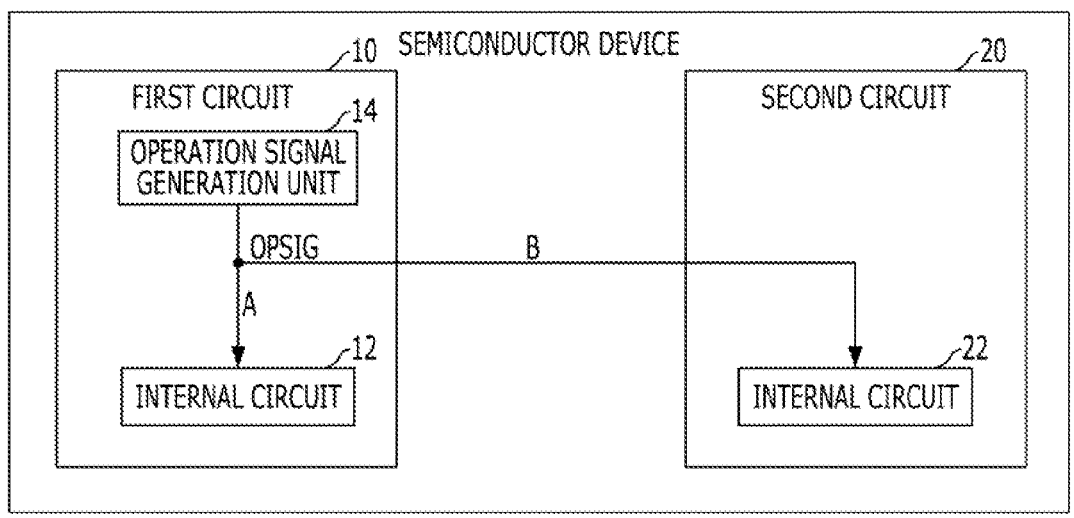
FIGS. 1 and 2 are block diagrams illustrating conventional semiconductor devices.
Figure 2:
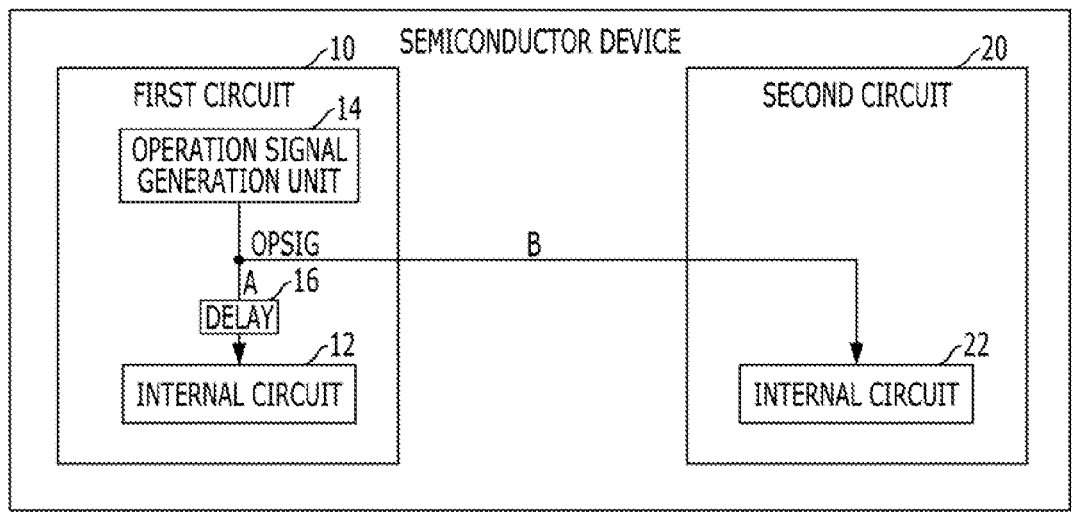

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
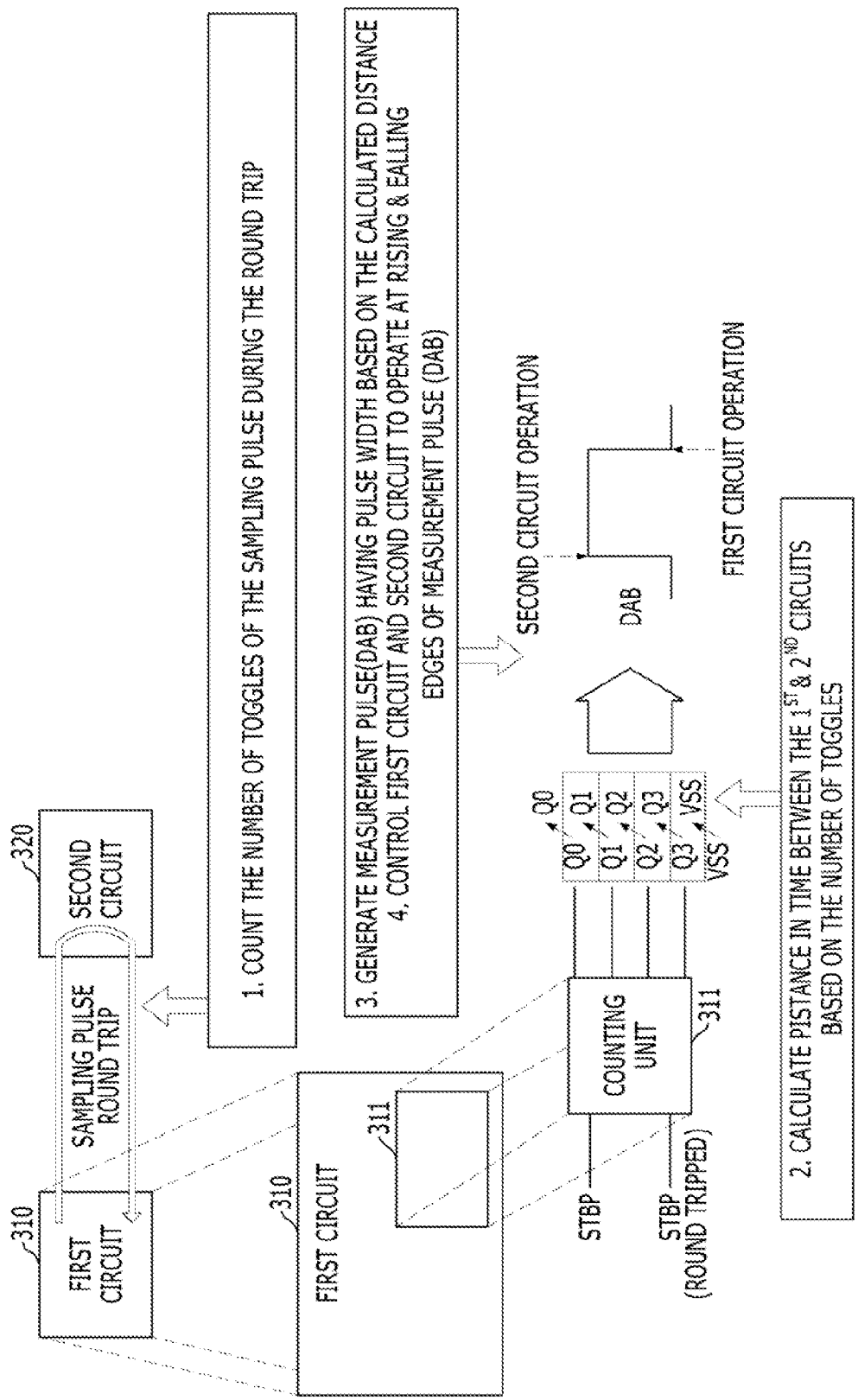
FIG. 3 is a schematic diagram illustrating a scheme of synchronous operations of first and second circuits that are physically separated from each other, in accordance with an embodiment of the present invention.

FIG. 3 is a schematic diagram illustrating a scheme of synchronous operations of first and second circuits physically separated from each other, in accordance with an embodiment of the present invention.

Referring to FIG. 3, the synchronous operations scheme of first and second circuits may use a pulse width of a measurement pulse DAB that represents the time taken for a single round trip of a sampling signal STBP.

The sampling signal STBP may be generated and transmitted by one of the first and second circuits 310 and 320, for example, the first circuit 310. The sampling signal STBP may be transmitted back to the first circuit 310 by the remaining circuit, here, the second circuit 320.

While the sampling signal STBP takes a round trip between the first and second circuits 310 and 320, the number of toggles Q[0:3] of the sampling signal STBP may be counted. Namely, the number of toggles Q[0:3] of the sampling signal STBP are counted during a round trip of the sampling signal STBP between the first and second circuits 310 and 320. As an example, a counter 311 may be provided in the first circuit 310, and may count the number of toggles Q[0:3] of the sampling signal STBP. As another example, the counter 311 may be provided in the second circuit 320, and may count the number of toggles Q[0:3] of the sampling signal STBP at least during the round trip of the sampling signal STBP from the second circuit 320 to the first circuit 310.

The counted number of toggles Q[0:3] of the sampling signal STBP may represent the time taken for a round trip of the sampling signal STBP between the first and second circuits 310 and 320. Therefore, the actual separation distance in time (i.e. the timing separation or timing difference) between the first and second circuits 310 and 320 may be acquired by dividing the counted number of toggles Q[0:3] of the sampling signal STBP by 2. To this end, the least significant bit value Q0 among the number of toggles Q[0:3] of the sampling signal STBP may be discarded, and the remaining bit values Q1, Q2 and Q3 may be shifted in a direction toward a position of the least significant bit value Q0 such that values of shifting result. Q[1:3] and VSS may be acquired.

The measurement pulse DAB may be generated on the basis of the values of shifting result Q[1:3] and VSS. The pulse width of the measurement pulse DAB may be defined according to the values of shifting result Q[1:3] and VSS. In other words, the pulse width of the measurement pulse DAB may be defined based on the pulse width of a unit pulse of the sampling signal STBP, and the values of shifting result Q[1:3] and VSS.

Thus, the pulse width of the measurement pulse DAB may represent the separation distance in time between the first and second circuits 310 and 320. Therefore, when first and second operation signals for each of the first and second circuits 410 and 420 are transmitted from an operation signal generation unit in the first circuit 310 to the internal circuits in the first and second circuits 310 and 320 at falling and rising edges of the measurement pulse DAB, respectively, an operation for the second circuit 320 may be performed in response to the second operation signal transmitted at the rising edge of the measurement pulse DAB, an operation for the first circuit 310 may be performed in response to the first operation signal transmitted at the falling edge of the measurement pulse DAB, and thus, both of the operations for the first and second circuits 310 and 320 may be synchronously performed regardless of the separation distance between the first and second circuits 310 and 320.

Figure 4:
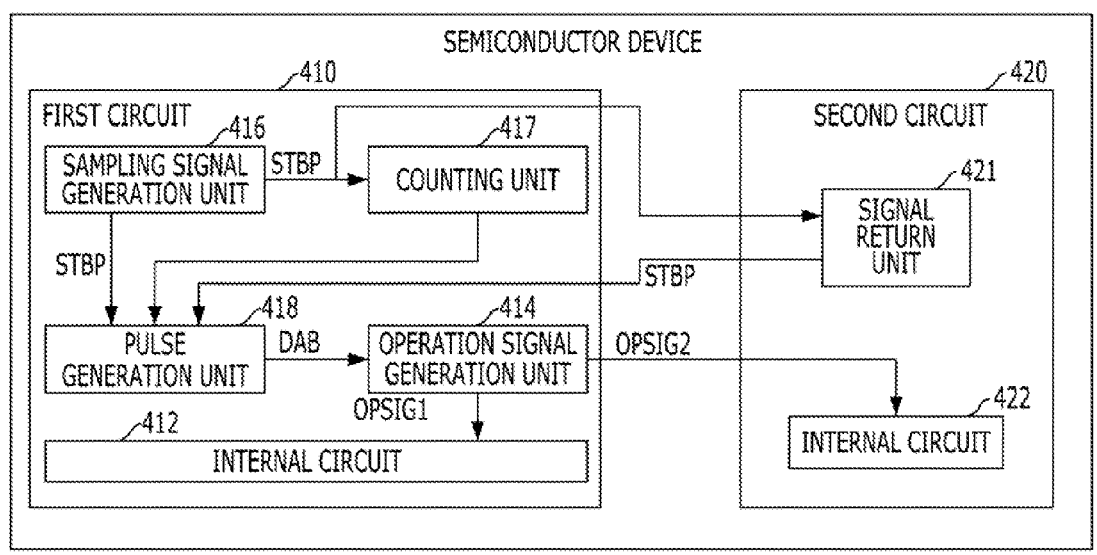
FIG. 4 is a block diagram illustrating a semiconductor device in accordance with an embodiment of the present invention.
Figure 5:
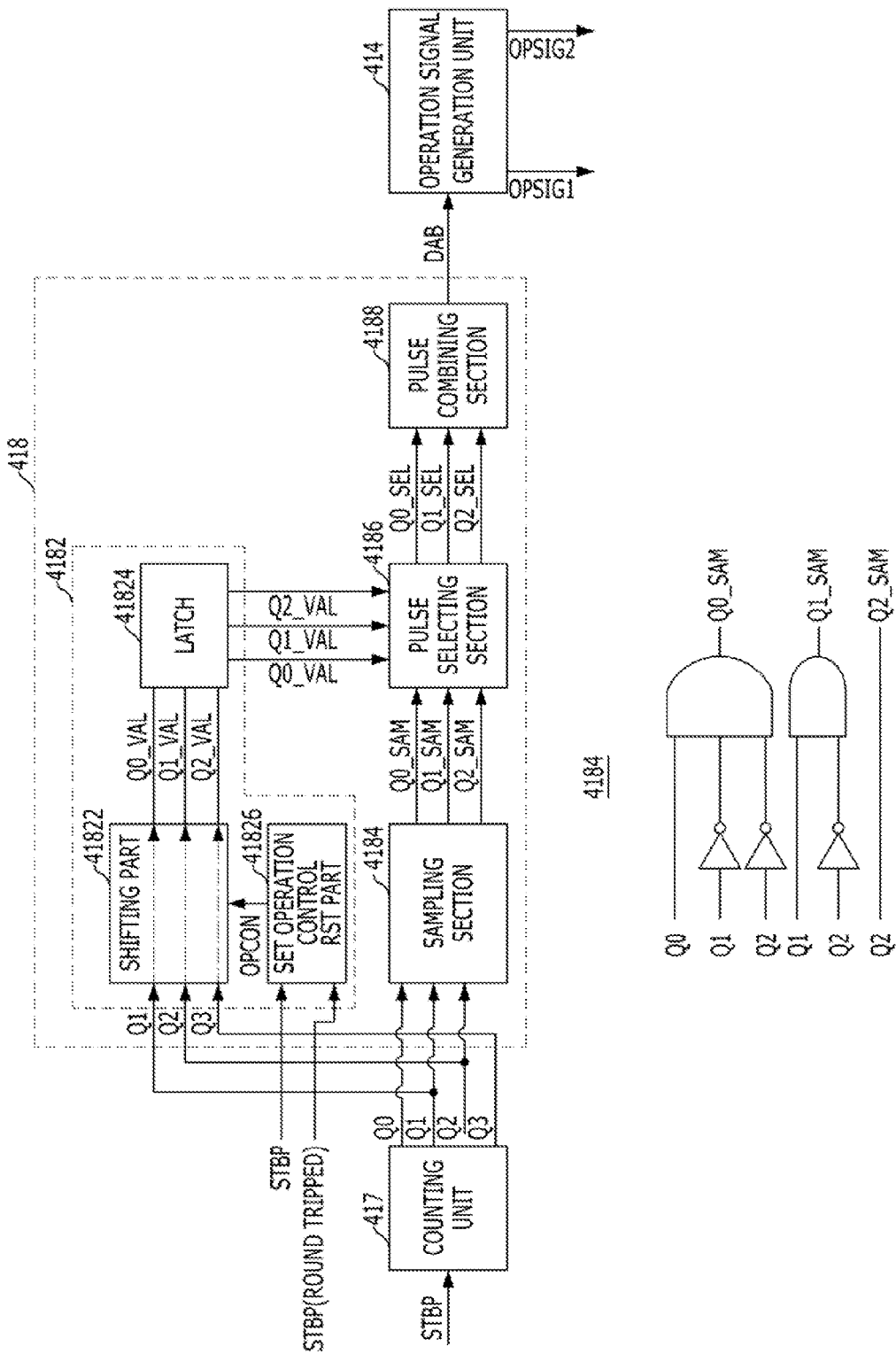
FIG. 5 is a block diagram illustrating a counting unit, a pulse generation unit, and an operation signal' generation unit shown in FIG. 4.

FIG. 4 is a block diagram illustrating a semiconductor device in accordance with an embodiment of the present invention, and FIG. 5 is a block diagram illustrating a counting unit, a pulse generation unit, and an operation signal generation unit shown in FIG. 4.

Referring to FIGS. 4 and 5, the semiconductor device may include first and second circuits 410 and 420. The first circuit 410 may include a sampling signal generation unit 416, a counting unit 417, a pulse generation unit 418, an operation signal generation unit 414, and an internal circuit 412. The second circuit 420 may include a signal returning unit 421 and an internal circuit 422.

The sampling signal generation unit 416 may generate the sampling signal STBP described above with reference to FIG. 3. The distance between the first and second circuits 410 and 420 may be measured through a round trip of the sampling signal STBP, which is generated by the sampling signal generation unit 416, between the first and second circuits 410 and 420. The sampling signal generation unit 416 may output the sampling signal STBP to the signal returning unit 421, and the signal returning unit 421 may return the sampling signal STBP to the pulse generation unit 418 which makes a round trip of the sampling signal STBP between the first and second circuit 410 and 420.

The counting unit 417 may count the number of toggles of the sampling signal' STBP in response to the sampling signal STBP outputted from the sampling signal generation unit 416.

The counter 4174 may generate count codes Q[0:3] by counting the number of toggles of the sampling signal STBP in response the sampling signal STBP outputted from the sampling signal generation unit 416.

The pulse generation unit 418 may generate the measurement pulse DAB, the pulse width of which may represent the distance in time between the first and second circuits 410 and 420, n response to count codes Q[0:3] of the counting unit 417.

The pulse generation unit 418 may include a calculating section 4182, a sampling section 4184, a pulse selecting section 4186, and a pulse combining section 4188.

The calculating section 4182 may generate distance codes Q[0:2]_VAL, which is half of the count codes Q[0:3] in value, in response to the sampling signal STBP outputted from the sampling signal generation unit 416, and the sampling signal STBP returned from the signal returning unit 421.

The calculating section 4182 may include a shifting part 41822, a latch 41824, and an operation control part 41326.

The operation control part 41826 may generate an operation control signal OPCON, which is activated in response to the sampling signal STBP outputted from the sampling signal generation unit 416, and is deactivated in response to the sampling signal STBP returned from the signal returning unit 421. The activation period of the operation control signal OPCON may represent the time taken for a round trip of the sampling signal STBP.

The shifting part 41822 may generate the distance codes Q[0:2]_VAL by discarding the least significant bit Q0 of the count codes Q[0:3], and shifting the remaining bits Q[1:3] in a direction toward a position of the least significant bit Q0 in response to the deactivation of the operation control signal OPCON outputted from the operation control part 41826. Among the count codes Q[0:3] outputted from the counter 4174, first to third codes Q[1:3] may be inputted to the shifting part 41822 except for the zeroth code Q0, or the least significant bit. The shifting part 41822 may generate the distance codes Q[0:2]_VAL by respectively shifting the first to third codes Q[1:3] to the position of the zeroth to second codes. The value of the distance codes Q[0:2]_VAL may represent half of the value of the count codes Q[0:3].

When the value of the count codes Q[0:3] is even, the shifting part 41822 may generate the distance codes Q[0:2]_VAL having a half of the count codes Q[0:3] in value. For example, when the value of the count codes Q[0:3] is odd, the shifting part 41822 may generate the distance codes Q[0:2]_VAL having a half of the count codes Q[0:3] minus 1 in value. Any other circuit design for dividing the count codes Q[0:3] may be adopted according to circuit design.

The latch 41824 may latch the distance codes Q[0:2]_VAL outputted from the shifting part 41822.

The sampling section 4184 may generate a plurality of sampling pulses Q[0:2]_SAM, which correspond to unit pulses for the zeroth to second bits Q[0:2] of the count codes Q[0:3], respectively. In detail, among the count codes Q[0:3] outputted from the counter 4174, zeroth to second codes Q[0:2] may be inputted to the sampling section 4184 except for the third code Q3, or the most significant bit. The sampling section 4184 may sample the unit pulses for the zeroth to second bits Q[0.2] in such a manner that the duration of the unit pulses for the zeroth to second bits Q[0:2] may not overlap with one another, and may output the plurality of sampling pulses Q[0:2]_SAM. In other words, the sampling section 4184 may sample first pulses of the zeroth to second bits Q[0:2] during each single cycle of the zeroth to second bits Q[0:2] of the count codes Q[0:3] to generate the sampling pulses Q[0:2]_SAM. As described above, each bit of the count codes Q[0:3] may cyclically change with its own period so that the value of the count codes Q[0:3] may increase one by one as the sampling signal STBP travels between the first and second circuits 410 and 420. Accordingly, the sampling pulses Q[0:2]_SAM or the first pulses of the zeroth to second bits Q[0:2] may not overlap with one another. As an example, the sampling section 4184 may include first and second AND logic gates. The first AND logic gate may generate the zeroth sampling pulse Q0_SAM by performing an AND operation to the zeroth bit Q0 and the inverted first bit Q1 and the inverted second bit Q2. The second AND logic gate may generate the first sampling pulse Q1_SAM by performing an AND operation to the first bit Q1 and the inverted second bit Q2. The sampling section 4181 may output the second bit. Q2 as the second sampling pulse Q2_SAM.

The pulse selecting section 4186 may select one or more of the plurality of sampling pulses Q[0:2]_SAM as the selection pulses Q[0:2]_SEL according to the distance codes Q[0:2]_VAL. That is to say, the pulse selecting section 4186 may select one or more of the plurality of sampling pulses Q[0:2]_SAM. A combination of the selected sampling pulses Q[0:2]_SAM may correspond to the distance codes Q[0:2]_VAL, the value of which represents half of the value of the count codes Q[0:3] at the deactivation of the operation control signal OPCON, which corresponds to the distance of a round trip between the first and second circuits 410 and 420. For example, the pulse selecting section 4186 may select the zeroth bit Q0_SAM among the plurality of sampling pulses Q[0:2]_SAM in response to the value of the zeroth bit Q0_VAL of the distance codes Q[0:2]_VAL. Further, the pulse selecting section 4186 may select the first bit Q1_SAM among the plurality of sampling pulses Q[0:2]_SAM in response to the value of the first bit Q1_VAL of the distance codes Q[0:2]_VAL, Moreover, the pulse selecting section 4186 may select the second bit Q2_SAM among the plurality of sampling pulses Q[0:2]_SAM in response to the value of the second bit Q2 VAL of the distance codes Q[0:2]_VAL.

The pulse combining section 4188 may generate the measurement pulse DAB based on the ones of the sampling pulses Q[0:2]_SAM selected by the pulse selecting section 4186, or the selection pulses Q[0:2]_SEL outputted from the pulse selecting section 4186. The activation period of the measurement pulse DAB may correspond to the sum of all the activation periods of the sampling pulses Q[0:2]_SAM selected by the pulse selecting section 4186, or the selection pulses Q[0:2]_SEL outputted from the pulse selecting section 4186.

The operation signal generation unit 414 may generate operation signals OPSIG1 and OPSIG2 for synchronous operations of the internal circuits 412 and 422 of the first and second circuits 410 and 420. The operation signal generation unit 414 may generate and output the operation signal OPSIG1 at the falling edge of the measurement pulse DAB to the internal circuit 412 of the first circuit 410, and may generate and output the operation signal OPSIG2 at the rising edge of the measurement pulse DAB to the internal circuit 422 of the second circuit 420. In other words, the operation signal generation unit 414 may transmit the operation signals OPSIG1 and OPSIG2 to the internal circuits 412 and 422 of the first and second circuits 410 and 420 at different timings, in order to input the operation signals OPSIG1 and OPSIG2 to the internal circuits 412 and 422 of the first and second circuits 410 and 420 at the same timings. The different timings may correspond to the activation period of the measurement pulse DAB, which represents the distance between the first and second circuits 410 and 420.

FIG. 6 is a timing diagram illustrating operations of a semiconductor device in accordance with an embodiment of the present invention.

FIG. 6 shows CASES I and II. CASE I represents a shorter distance between the first and second circuits 410 and 420, and CASE II represents a longer distance between the first and second circuits 410 and 420.

Referring to FIG. 6, the operation control signal OPCON may be activated in response to the output of the toggling sampling signal STBP from the sampling signal generation unit 416, and may be deactivated in response to the arrival of the round-tripped sampling signal STBP from the signal return unit 421. The counting unit 417 may start count the number of toggles of the sampling signal STBP to generate the count codes Q[0:3], which cyclically change so that the value of the count codes Q[0:3] may increase one by one in response in response to the activation of the operation control signal OPCON.

The count codes Q[0:3] may change in such a manner that the value of the count codes Q[0:3] may increase one by one at every toggle of the sampling signal STBP. For example, the count codes Q[0:3] may sequentially change from '0000' to '1111'. The sampling section 4184 may sample first pulses of the zeroth to second bits Q[0:2] during each single cycle of the zeroth to second bits Q[0:2] of the count codes Q[0:3] to generate the sampling pulses Q[0:2]_SAM. As described above, each bit of the count codes Q[0:3] may cyclically change with its own period so that the value of the count codes Q[0:3] may increase one by one as the sampling signal STEP travels between the first and second circuits 410 and 420. Accordingly, the sampling pulses Q[0:2]_SAM or the first pulses of the zeroth to second bits Q[0:2] may not overlap with one another.

As shown in FIG. 6, the count codes Q[0:3] of CASE I may be '0101' when the operation control signal OPCON is deactivated, and thus the calculating section 4182 may generate the distance codes Q[0:2]_VAL which are '010' representing the half of the count codes Q[0:3] '0101' in value. Also as shown in FIG. 6, the count codes Q[0:3] of CASE II may be '1100' when the operation control signal OPCON is deactivated, and thus the calculating section 4182 may generate the distance codes Q[0:2]_VAL, which are '110' representing the half of the count codes Q[0:3] '1100' in value.

With the distance codes Q[0:2]_VAL '010' in CASE I, the pulse selecting section 4186 may select the first sampling pulse Q1_SAM. The pulse combining section 4188 may output a measurement pulse DAB having a pulse width of the first sampling pulse Q1_SAM in CASE I. The pulse width of the first sampling pulse Q1_SAM or the measurement pulse DAB may represent a shorter distance between the first and second circuits 410 and 420 in CASE I.

With the distance codes Q[0:2]_VAL '110' in CASE II, the pulse selecting section 4186 may select the first and second sampling pulses Q1_SAM and Q2_SAM. The pulse combining section 4188 may output a measurement pulse DAB having a pulse width corresponding to the sum of the pulse widths of the first and second sampling pulses Q1_SAM and Q2_SAM in CASE H. The sum of the pulse widths of the first and second sampling pulses Q1_SAM and Q2_SAM or the pulse width of the measurement pulse DAB may represent a longer distance between the first and second circuits 410 and 420 in CASE H.

Based on the activation period of the measurement pulse DAB, the operation signal generation unit 414 may generate operation signals OPSIG1 and OPSIG2 for synchronous operations of the internal circuits 412 and 422 of the first and second circuits 410 and 420. The operation signal generation unit 414 may transmit the operation signals OPSIG1 and OPSIG2 to the internal circuits 412 and 422 of the first and second circuits 410 and 420 at different timings, in order to input the operation signals OPSIG1 and OPSIG2 to the internal circuits 412 and 422 of the first and second circuits 410 and 420 at the same timings. The different timings may correspond to the activation period of the measurement pulse DAB.

The described code length of 4 bits is an example, which may vary according to circuit design. For example, the code length may be more than 4 bits when the distance between the first and second circuits are great. Also, the frequency of the sampling signal STBP may depend on the circuit design. For example, the higher the frequency of the sampling signal STBP is, the more precise the measurement of the distance is.

In addition, the above-described concept of the present invention may be applied to a semiconductor system including first and second semiconductor devices, or first and second chips. Namely, the above-described concept of the present invention may cover a semiconductor system, which includes two semiconductor devices (or chips) disposed separately from each other.

According to the various exemplary embodiments of the present invention, it is possible for a semiconductor device to allow simultaneous operations of physically separated circuits when needed. Also, a semiconductor device may allow the simultaneous operations of physically separated circuits even when there is unintended variation in the path between the master and slave circuits after packaging of the semiconductor device is completed.

Although various embodiments have been described for illustrative purposes, it will be apparent to those skilled in the art that various changes and modifications may be made without departing from the spirit and scope of the invention as defined in the following claims.

For example, the above embodiments were described on the assumption that two circuits (semiconductor devices or semiconductor chips) are disposed separately from each other in one semiconductor device (semiconductor system). However, this is only an example and the inventive concept disclosed herein may be applied to three or even hundreds of separate circuits (semiconductor devices or semiconductor chips) or may be applied to multiple devices which form a semiconductor system.

Also, the position and type of the logic gates and transistors exemplified in the above-described embodiments can be differently realized according to the polarities of the signals inputted thereto.

What is claimed:
1. A semiconductor device comprising:
    first and second circuits disposed separately from each other,
    wherein the first circuit comprises:
    a counting unit suitable for generating count codes having bits, each bit of which is cyclically changing, wherein the count codes include a number of toggles of a sampling signal having a preset frequency representing a distance of a single round trip of the sampling signal between the first and second circuits; and
    a pulse generation unit suitable for generating a measurement pulse according to the count codes representing the distance, wherein the pulse generation unit determines a pulse width of the measurement pulse according to the distance.
2. The semiconductor device of claim 1, wherein the first circuit further comprises an operation signal generation unit suitable for generating and transmitting an operation signal to the first circuit at a falling edge of the measurement pulse, and generating and transmitting the operation signal to the second circuit at a rising edge of the measurement pulse.
3. The semiconductor device of claim 2, wherein the pulse generation unit comprises:
    an operation control section suitable for generating an operation control signal, which is activated during the single round trip of the sampling signal between the first and second circuits;
    a calculating section suitable for generating distance codes, which have a value corresponding to a half of a value of the count codes in response to deactivation of the operation control signal;
    a sampling section suitable for generating a plurality of sampling pulses by sampling first unit pulses of bits except for a most significant bit in the count codes per one cycle of the bits except for the most significant bit in the count codes;
    a pulse selecting section suitable for selecting one or more among the plurality of sampling pulses according to the distance codes; and
    a pulse combining section suitable for generating the measurement pulse, which has an activation period corre- sponding to a sum of activation periods of the sampling pluses selected by the pulse selecting section.

4. The semiconductor device of claim 3, wherein the calculating section comprises a shifting part suitable for generating the distance codes by shifting each bit except for a least significant bit in the count codes in a direction towards a position of a lower significant level.

5. The semiconductor device of claim 4, wherein the pulse selecting section selects one or more among the plurality of sampling pulses corresponding to the value of the distance codes.

6. A method for operating a semiconductor device including a first circuit and a second circuit disposed separately from each other, the method comprising:
at the first circuit, generating and outputting a sampling signal, which toggles with a preset frequency, to the second circuit, and receiving the sampling signal returning from the second circuit;
at the first circuit, generating count codes, each bit of which is cyclically changing, wherein the count codes include a number of toggles of the sampling signal representing a distance of single round trip of the sampling signal between the first and second circuits; and
at the first circuit, generating a measurement pulse according to the count codes representing the distance, wherein the generating of the measurement pulse determines a pulse width of the measurement pulse according to the distance.

7. The method of claim 6, further comprising:
at the first circuit, generating and transmitting an operation signal to the first circuit at a falling edge of the measurement pulse, and generating and transmitting the operation signal to the second circuit at a rising edge of the measurement pulse.

8. The method of claim 7, wherein the generating of the measurement pulse comprises:
at the first circuit, generating an operation control signal, which is activated during the single round trip of the sampling signal between the first and second circuits;
at the first circuit, generating distance codes, which have a value corresponding to a half of a value of the count codes in response to deactivation of the operation control signal;
at the first circuit, generating a plurality of sampling pulses by sampling first unit pulses of bits except for a most significant bit in the count codes per one cycle of the bits except for the most significant bit in the count codes;
at the first circuit, selecting one or more among the plurality of sampling pulses according to the distance codes; and
at the first circuit, generating the measurement pulse, which has an activation period corresponding to a sum of activation periods of the sampling pulses selected by the selecting.

9. The method of claim 6, wherein the generating of the distance codes generates the distance codes by shifting each bit except for a least significant bit in the count codes in a direction towards a position of a lower significant level.

10. The method of claim 9, wherein the selecting selects one or more among the plurality of sampling pulses corresponding to the value of the distance codes.

11. A semiconductor system comprising:
a signal portion suitable transmitting an operation signal;
a first portion suitable for perform an operation in response to the operation signal transmitted through a first path; and
a second portion suitable for performing an operation in response to the operation signal transmitted through a second path, a length of which is different from a length of the first path,
wherein the signal portion measures a length of the second path relative to the first path, and sequentially transmits the operation signal through the second path and the first path with a time interval corresponding to the measured distance of the second path for synchronous operations of the first and second portions.

12. The semiconductor system of claim 11, wherein the first path has a length that is relatively negligible compared to the length of the second path.

13. The semiconductor system of claim 1,
further comprising:
a source portion suitable for generating and outputting a traveling signal through the second path; and
a counting portion suitable for generating count codes by counting a clock in response to the output of the traveling signal from the source portion,
wherein the second portion receives and returns back the traveling signal to the signal portion through the second path, and
wherein the signal portion generates round trip codes from the count codes during the round trip of the traveling signal between the source portion and the signal portion.

14. The semiconductor system of claim 13, wherein the signal portion comprises:
a pulse unit suitable for generating a measurement pulse representing the measured distance of the second path based on the round trip codes; and
an operating signal unit suitable for generating and transmitting the operation signal to the first portion at a first edge of the measurement pulse, and generating and transmitting the operation signal to the second portion at a second edge of the measurement pulse.

15. The semiconductor system of claim 14, wherein the second edge leads the first edge in time.

16. The semiconductor system of claim 14, wherein the pulse unit comprises:
a calculating section suitable for generating distance codes, which is a half of the round trip codes in a code value;
a sampling section suitable for generating a plurality of sampling pulses by sampling first unit pulses of bits except for a most significant bit in the count codes per one cycle of the bits except for the most significant bit in the count codes;
a pulse selecting section suitable for selecting one or more among the plurality of sampling pulses according to the distance codes; and
a pulse combining section suitable for generating the measurement pulse based on a sum of preset states of the sampling pulses selected by the pulse selecting section.

17. The semiconductor system of claim 16, wherein the calculating section comprises a shifting part suitable for generating the distance codes by shifting each bit except for a least significant bit in the round trip codes toward a position of a lower significant level.

18. The semiconductor device of claim 17, wherein the pulse selecting section selects one or more among the plurality of sampling pulses corresponding to the code value of the distance codes.

* * * * *